(12) United States Patent
Saita et al.

(10) Patent No.: US 6,972,264 B2
(45) Date of Patent: Dec. 6, 2005

(54) METHOD AND APPARATUS FOR ETCHING SI

(75) Inventors: Yoshitaka Saita, Nirasaki (JP); Masashi Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/654,889

(22) Filed: Sep. 5, 2003

(65) Prior Publication Data

US 2004/0048487 A1 Mar. 11, 2004

(30) Foreign Application Priority Data

Sep. 6, 2002 (JP) .............................. 2002-260936

(51) Int. Cl.[7] .......................................... H01L 21/302
(52) U.S. Cl. .................... 438/714; 216/71; 216/79; 438/719; 438/729
(58) Field of Search .............................. 438/714, 719, 438/729; 216/71, 79; 156/345.29, 345.34, 156/345.47

(56) References Cited

U.S. PATENT DOCUMENTS

| | | | |
|---|---|---|---|
| 5,242,536 A | * | 9/1993 | Schoenborn ................ 438/714 |
| 5,595,627 A | * | 1/1997 | Inazawa et al. ............. 438/715 |
| 6,322,714 B1 | * | 11/2001 | Nallan et al. ................ 216/67 |
| 6,562,722 B2 | * | 5/2003 | Kumihashi et al. ......... 438/714 |
| 6,620,575 B2 | * | 9/2003 | Kim et al. ................... 430/314 |
| 6,749,763 B1 | * | 6/2004 | Imai ............................ 216/59 |

FOREIGN PATENT DOCUMENTS

JP 2002-319569 * 10/2002

OTHER PUBLICATIONS

"Radio Frequency Plasma Etching of Silicon/Silica By Chlorine/Oxygen: Improvemenets Resulting From Time Modulation of The Processing Gases"; Journal of Vacuum Science & Technology, B: (1990); 8(6), pp. 1185-1191; McNevin.*

* cited by examiner

Primary Examiner—George A. Goudreau
(74) Attorney, Agent, or Firm—Oblon, Spivak, McClelland, Maier & Neustadt, P.C.

(57) ABSTRACT

A method for dry-etching a Si substrate or a Si layer in a processing chamber includes the step of supplying an etching gas into the processing chamber, wherein the etching gas is a mixture gas including $Cl_2$, $O_2$ and $NF_3$ and a residence time $\tau$ of the etching gas is equal to or greater than about 180 msec, the residence time $\tau$ being defined as:

$$\tau = pV/Q$$

where p represents an inner pressure of the processing chamber; V, an effective volume of etching space formed on the Si substrate or the Si layer; and Q, a flow rate of the etching gas.

6 Claims, 6 Drawing Sheets

$V = A \cdot H$

V(VOLUME)

H(GAP)

A(WAFER AREA)

$\tau = V/S = PV/Q$ $\tau$ : RESIDENCE TIME (s)
V : EFFECTIVE ETCHING VOLUME (=AxH) (l)
S : EXHAUST RATE OF ETCHING GAS (l/s)
A : WAFER AREA
H : ELECTRODE GAP
P : PATIAL PRESSURE (torr) OF ETCHING GAS
Q : TOTAL FLOW RATE (torr•l/s) OF ETCHING GAS

FIG. 3

| | Cl$_2$ (sccm) | O$_2$ (sccm) | NF$_3$ (sccm) | TOTAL FLOW RATE (sccm) | Cl$_2$+O$_2$ (sccm) | O$_2$ ratio (O$_2$/Cl$_2$+O$_2$) | RESIDENCE TIME (msec) | TAPER ANGLE (deg.) | Si E/R (μm/min) | SELECTIVITY (Si/SiO$_2$) |
|---|---|---|---|---|---|---|---|---|---|---|
| EXAMPLE 1 | 16 | 4 | 20 | 40 | 20 | 0.20 | 428.2 | 89.3 | 0.81 | — |
| EXAMPLE 2 | 19 | 6 | 20 | 45 | 25 | 0.24 | 380.6 | 89.0 | 0.81 | 28.70 |
| EXAMPLE 3 | 20 | 5 | 20 | 45 | 25 | 0.20 | 380.6 | 89.2 | 0.78 | — |
| EXAMPLE 4 | 65 | 15 | 20 | 100 | 80 | 0.19 | 171.3 | 87.6 | 1.01 | — |
| EXAMPLE 5 | 85 | 20 | 20 | 125 | 105 | 0.19 | 137.0 | 87.5 | 0.78 | — |
| EXAMPLE 6 | 110 | 30 | 20 | 160 | 140 | 0.21 | 107.0 | 87.7 | 0.78 | — |
| EXAMPLE 7 | 130 | 30 | 20 | 180 | 160 | 0.19 | 95.1 | 87.8 | 0.80 | — |
| EXAMPLE 8 | 145 | 15 | 20 | 180 | 160 | 0.09 | 95.1 | 91.8 | 1.20 | — |

FIG.5

| | HBr (sccm) | O₂ (sccm) | NF₃ (sccm) | HBr+O₂ (sccm) | O₂ ratio (O₂/HBr+O₂) | TAPER ANGLE (deg.) | Si E/R (µm/min) |
|---|---|---|---|---|---|---|---|
| COMPARATIVE EXAMPLE 1 | 100 | 1 | 24 | 101 | 1% | 92.3 | 0.26 |
| COMPARATIVE EXAMPLE 2 | 100 | 1 | 0 | 101 | 1% | 87.5 | 0.24 |

$V = A \cdot H$ $\tau = V/S = PV/Q$

τ : RESIDENCE TIME (s)
V : EFFECTIVE ETCHING VOLUME (=A×H) (l)
S : EXHAUST RATE OF ETCHING GAS (l/s)
A : WAFER AREA
H : ELECTRODE GAP
P : PATIAL PRESSURE (torr) OF ETCHING GAS
Q : TOTAL FLOW RATE (torr·l/s) OF ETCHING GAS

METHOD AND APPARATUS FOR ETCHING SI

FIELD OF THE INVENTION

The present invention relates to a method and apparatus for etching Si (silicon); and, more particularly, to a method and an apparatus for forming a trench with a narrow width and a deep depth in a Si substrate or a Si layer.

BACKGROUND OF THE INVENTION

A shallow trench isolation (STI) scheme is widely used in the manufacture of LSI (large scale integrated) circuits to isolate devices or elements thereof. The STI generally includes the step of dry-etching in a Si substrate a relatively shallow trench (or groove) having a depth of 1 μm or less by using a photoresist or an insulating layer as a mask. Such a trench etching requires a technique to control a trench depth and a trench profile, especially a sidewall angle (taper angle).

Conventionally, a Br (bromine)-based mixture gas, typically a mixture gas of HBr and $O_2$, is widely used as an etching gas for the STI procedure. HBr is a relatively less reactive with an oxide layer ($SiO_2$) formed by $O_2$ on a sidewall of the trench, so that the trench is more likely to have a tapered profile. In other words, when compared with etching gases based on other halogen elements of, e.g., F and Cl, HBr provides a better controllability over a thickness and a taper angle of a sidewall protection layer. As for the taper profile, since the depth of a trench used in the STI technology is shallow, the tapered profile of the trench rarely has an adverse effect in forming an STI. On the contrary, it is understood that the tapered profile is preferred to a vertical profile since the tapered profile can prevent a void from occurring in the course of filling the trench with an insulating material.

However, as the device density increases with the spacing-down of devices in the LSI, a deep trench isolation (DTI) is gaining favor over the STI due to its high device isolation capability. Since a DTI procedure includes the step of etching a relatively deep trench (or groove) having a depth of from about 3 to 5 μm into a Si substrate, a trench etching technique compatible with a high aspect ratio is required.

However, the deep trench with a high aspect ratio cannot be formed with the mixture gas of HBr and $O_2$ and thus this mixture gas is not compatible with the DTI. Moreover, this mixture gas presents a several drawbacks such as a low etching rate and thus a poor processing efficiency and a low productivity.

SUMMARY OF THE INVENTION

It is, therefore, an object of the present invention to provide a method and apparatus capable of etching Si for the manufacture of a trench structure having a high aspect ratio with an enhanced etching rate.

In accordance with one aspect of the invention, there is provided a method for dry-etching a Si substrate or a Si layer in a processing chamber, including the step of:

supplying an etching gas into the processing chamber, wherein the etching gas is a mixture gas including $Cl_2$, $O_2$ and $NF_3$ and a residence time τ of the etching gas is equal to or greater than about 180 msec, the residence time τ being defined as:

$$\tau = pV/Q$$

where p represents an inner pressure of the processing chamber; V, an effective volume of etching space formed on the Si substrate or the Si layer; and Q, a flow rate of the etching gas.

In accordance with another aspect of the invention, there is provided a apparatus for etching a Si substrate or a Si layer, including:

a processing chamber which is provided with a gas inlet and a gas outlet, and removably accommodates therein the Si substrate or an object having the Si layer;

an etching gas supply unit which mixes $Cl_2$, $O_2$ and $NF_3$ to provide an etching gas and supplies the etching gas to the processing chamber through the gas inlet;

a plasma generator for generating a plasma of the etching gas;

a discharge unit which evacuates an interior of the processing chamber through the gas outlet to maintain an inner pressure of the processing chamber at a level, wherein etching of the Si substrate or the Si layer is carried out while maintaining a residence time τ at a level equal to or greater than about 180 msec, the residence time τ being defined as:

$$\tau = pV/Q$$

where p represents an inner pressure of the processing chamber; V, an effective volume of etching space formed on the Si substrate or the Si layer; and Q, a flow rate of the etching gas.

In the present invention, a mixture gas including $Cl_2$, $O_2$ and $NF_3$ is employed as an etching gas. $Cl_2$, a primary etchant for etching Si, reacts with Si with a higher reaction possibility than HBr to produce a highly volatile material, so that a high etching rate can be obtained. $O_2$ reacts with Si to form a side etching-resistant oxide layer or a protection layer ($SiO_x$) on a sidewall of an etched groove. $NF_3$ prevents the sidewall protection layer from overgrowing, so that the etchant can be readily introduced into a deep portion or a bottom part of the etched groove, rendering Si to be etched anisotropically.

In an etching treatment for forming a deep vertical groove (or a trench) with a small opening width, it is important to balance a deposition rate and an etching rate near the bottom of the etched groove. In the present invention, the etching of Si is performed under a condition that a residence time τ is equal to or greater than about 180 msec.

As an example, the flow rate Q of the etching gas is required to be equal to or less than about 95 sccm in order to keep the residence time τ being equal to or greater than about 180 msec if a parallel plate type plasma etching apparatus is used for performing an etching treatment under a condition as follows: the diameter of a Si wafer is 200 mm, an inner pressure of a chamber is 60 mtorr and an electrode gap is 115 mm.

In the present invention, it is preferable to set the sum of flow rates of $Cl_2$ and $O_2$ to be equal to or greater than about 80% of the total flow rate of the etching gas ($Cl_2/O_2/NF_3$) Therefore, in the example aforementioned, it is preferable to set the sum of the flow rates of $Cl_2$ and $O_2$ to be equal to or less than about 75 sccm.

Further, the ratio of flow rates between $O_2$ and $Cl_2$ is also an important parameter. The ratio of flow rate of $O_2$ to the sum of the flow rates of $Cl_2$ and $O_2$ (will be referred to as the $O_2$ ratio hereinafter) is preferably set to range from about 0.1 to about 0.3 and more preferably to range from about 0.15 to about 0.25. If the $O_2$ ratio is excessively high, a growth rate of an accumulation layer on the sidewall becomes higher, so that a taper angle becomes less or the etching rate becomes smaller. In contrast, if the $O_2$ ratio is excessively low, the protection of the sidewall becomes deteriorated, so that the etched groove is apt to have a reversely tapered profile or a bowing profile.

Further, in the present invention, an inert gas such as Ar can be mixed with the etching gas as a diluent gas; and it is preferable to set the total flow rate of the etching gas to be equal to or less than about 100 sccm. Moreover, it is preferable to set the etching pressure to range from about 20 mtorr to about 200 mtorr; and in case of a parallel pate type electrodes, it is also preferable to set the distance between electrodes to range from about 30 mm to about 300 mm.

In the etching apparatus of the present invention, it is preferred that a plasma generator in a chamber is provided with a pair of electrodes facing each other, i.e., a first electrode on which an object to be processed is loaded and a second electrode spaced apart from the first electrode by a predetermined distance. In such a case, ion assist etching can be performed by applying a high frequency power to the first electrode.

BRIEF DESCRIPTION OF THE DRAWINGS

The above and other objects and features of the present invention will become apparent from the following description of preferred embodiments given in conjunction with the accompanying drawings, in which:

FIG. 3 sets forth etching conditions and characteristics of various examples used in the present invention;

FIG. 5 offers etching conditions and characteristics of comparative examples.

DETAILED DESCRIPTION OF THE PREFERRED EMBODIMENTS

The preferred embodiments of the present invention will now be described with reference to FIGS. 1 to 6.

Figure 1:
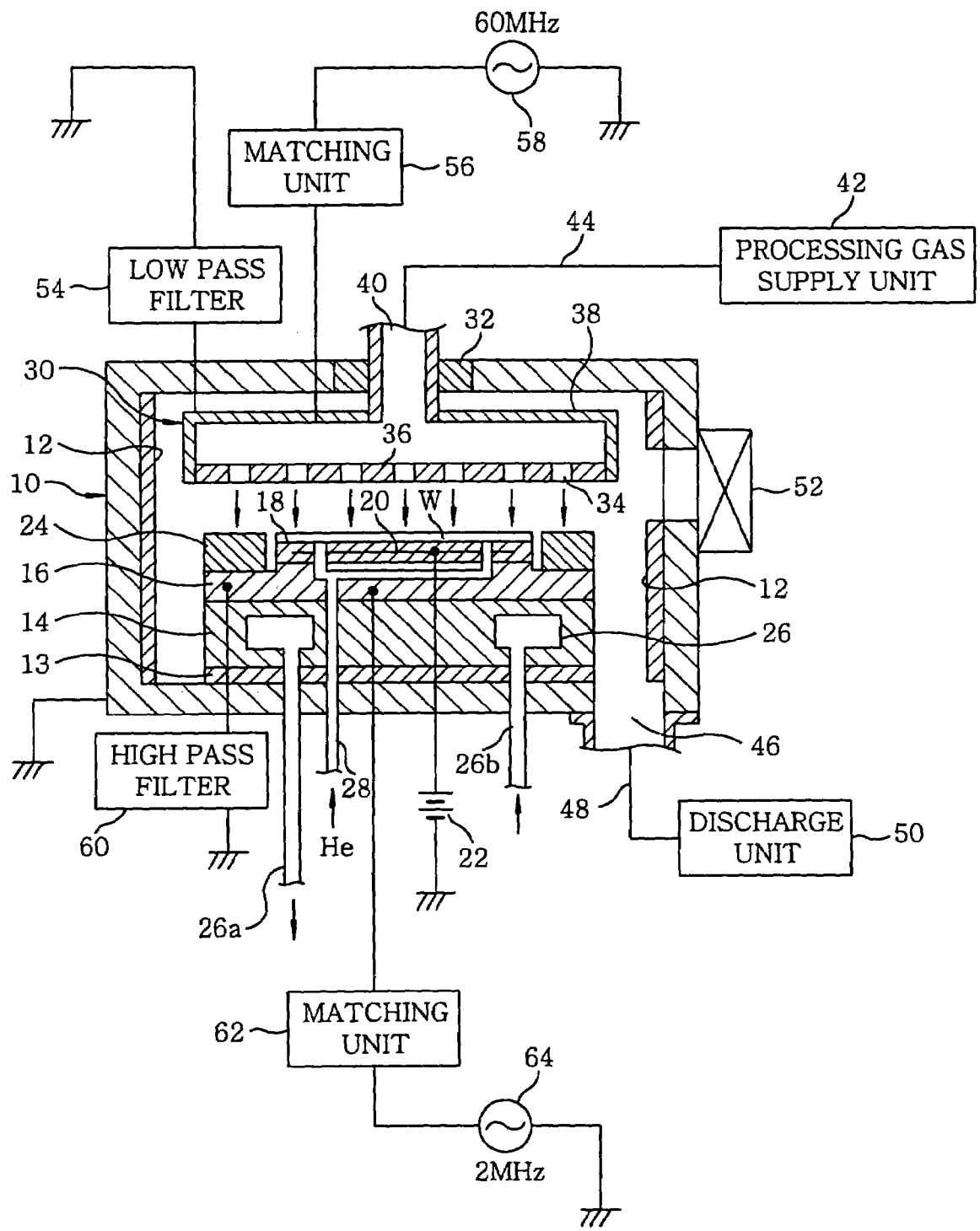
FIG. 1 shows an etching apparatus in accordance with a preferred embodiment of the present invention.

Referring to FIG. 1, there is illustrated an etching apparatus in accordance with a preferred embodiment of the present invention. The etching apparatus is a parallel plate type plasma etching apparatus and includes a cylindrical chamber 10 formed of aluminum, whose surface is alumite-treated (i.e., treated by anodic oxidation). The chamber 10 is grounded.

Disposed on an inner wall of the chamber 10 is a cylindrical deposition shield 12 formed of alumina. Supported by a bottom wall of the chamber 10 through an insulation plate 13 such as ceramic is a columnar susceptor supporting table 14, on which a susceptor 16, e.g., formed of aluminum, is disposed. The susceptor 16 serves as a lower electrode, on which an object to be processed, e.g., a single crystal Si substrate or a Si wafer, is loaded.

Disposed on top of the susceptor 16 is an electrostatic chuck 18, which holds a Si wafer W by the force of electrostatic attraction. The electrostatic chuck 18 is provided with an electrode 20 formed of a conductive sheet which is buried between a pair of insulating sheets and electrically connected to a DC power supply 22. The Si wafer W is adhered on the electrostatic chuck 18 by the coulomb force generated therebetween by the application of a DC voltage thereto from the DC power supply 22. Disposed around the electrostatic chuck 18 above the level of the susceptor 16 is a focus ring 24 formed of, e.g., quartz, for improving etching uniformity.

In the susceptor supporting table 14, a coolant passageway 26 is formed, for example, along the periphery thereof. A coolant, e.g., a cooling water, of a predetermined temperature is circularly supplied to the coolant passageway 26 from an external chiller unit (not shown) through coolant lines 26a and 26b. Thus, a temperature of the Si wafer W on the susceptor 16 can be controlled by controlling a temperature of the coolant.

Further, a cooling gas, e.g., helium, is supplied from a cooling gas supply source (not shown) into a gap between an upper surface of the electrostatic chuck 18 and a lower surface of the Si wafer W through a gas supply line 28. The cooling gas supply source is configured to control back pressures at a central portion and a peripheral portion independently in order to improve the etching uniformity over the entire surface of the Si wafer W.

Installed above the susceptor 16 in a manner to face parallel to the susceptor 16 is an upper electrode 30 supported by the chamber 10 through an insulating member 32. The upper electrode 30 is provided with an electrode plate 36 at a lower portion thereof, which has a plurality of holes 34 and is formed of ceramic such as alumina; and an electrode supporting member 38, which supports the electrode plate 36 and is formed of a conductive material such as aluminum having its surface subjected to alumite treatment. Encompassed by the electrode plate 36 and the electrode supporting member 38 is a buffer space, on an upper central portion of which a gas inlet opening 40 is disposed. The gas inlet opening 40 is connected with a processing gas supply unit 42 via a gas supply line 44.

Formed at the bottom wall of the chamber 10 is an exhaust opening 46, which is connected with a discharge unit 50 through an exhaust line 48. The discharge unit 50 is provided with a vacuum pump such as a turbo molecular pump and reduces a pressure of an etching space within the chamber 10 to a predetermined vacuum level. Further, installed on the sidewall of the chamber 10 is a gate valve 52 which opens and closes an opening for conveying the Si wafer W into and from the chamber 10.

Connected to the upper electrode 30 via a matching unit 56 is a first high frequency power supply 58, which applies thereto a power of high frequency ranging from about 50 to 150 MHz, and typically the power of about 60 MHz thereto. In addition, the upper electrode 30 is connected to the ground via a low pass filter 54.

Connected to the lower electrode, i.e., the susceptor 16, via a matching unit 62 is a second high frequency power supply 64, which applies thereto a power of high frequency ranging from about 1 to 4 MHz and typically the power of around 2 MHz thereto. In addition, the susceptor 16 is connected with the ground via a high pass filter 60.

In the preferred embodiment, an electrode gap, i.e., a distance between the upper electrode 30 and the lower electrode (susceptor 16), is preferably set to range from about 30 to about 300 mm.

To perform an etching treatment with this plasma etching apparatus, a Si wafer W to be processed is first conveyed into the chamber 10 and loaded on the susceptor 16 after the gate valve 52 is opened. Then after closing the gate valve 52, an etching gas with a certain flow rate is introduced into the chamber 10 from the processing gas supply unit 42 and the inner pressure of the chamber 10, i.e., an etching pressure, is set to a predetermined pressure, preferably ranging from about 20 mtorr to about 200 mtorr, by the discharge unit 50. The first high frequency power supply 58 applies a predetermined power level of a frequency of about 60 MHz to the upper electrode 30 and the second high frequency power supply 64 applies a predetermined power having a frequency of about 2 MHz to the susceptor 16. Further, the DC power supply 22 applies a DC voltage to the electrode 20 of the electrostatic chuck 18, so that the Si wafer W is fixedly adhered on the susceptor 16. The etching gas introduced into the etching space from the electrode plate (or shower head) 36 through the plurality of holes 34 thereof is transformed into a plasma state by the glow discharge between the upper and lower electrodes 30 and 16, so that radicals and ions of the etching gas produced by the plasma etch the Si wafer W.

In the plasma etching apparatus of this preferred embodiment, generation of a high density plasma with a proper dissociation state under a relatively low pressure is achieved by applying to the upper electrode 30 a frequency ranging from about 50 to about 150 MHz, which is higher than a conventional one (generally about 27 MHz). Further, by applying to the susceptor 16 serving as the lower electrode a frequency ranging between about 1 and about 4 MHz, which is higher than a conventional one (generally about 800 KHz), a RIE (reactive ion etching) is properly carried out under a relatively low pressure.

Figure 2:
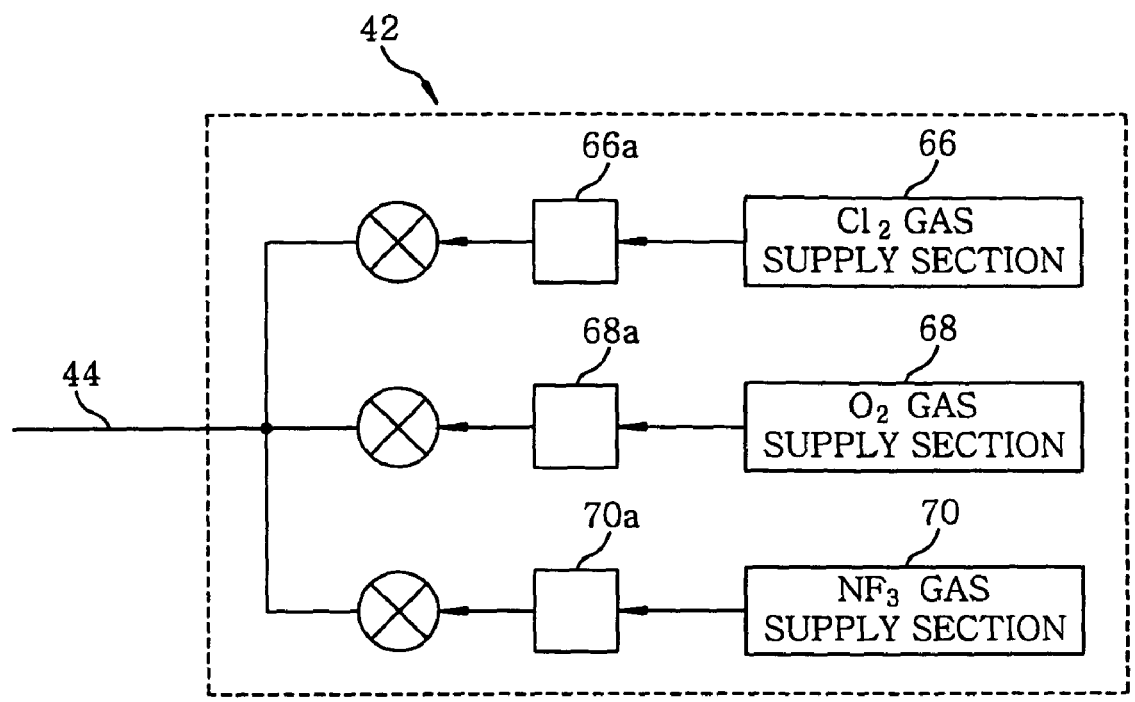
FIG. 2 illustrates a processing gas supply unit of the etching apparatus of FIG. 1.

In this preferred embodiment, the etching gas is a mixture gas including $Cl_2$, $O_2$ and $NF_3$. Thus, the processing gas supply unit 42 is provided with a $Cl_2$ gas supply section 66, an $O_2$ gas supply section 68 and an $NF_3$ gas supply section 70 as shown in FIG. 2, wherein gas flow rates thereof are independently controlled by corresponding mass flow controllers 66a, 68a and 70a, respectively. Further, an inert gas, e.g., Ar gas, serving as a diluent gas can be mixed with the etching gas. In such a case, a diluent gas supply section (not shown) needs to be installed in the processing gas supply unit 42.

Details of examples carried out in accordance with the Si etching method of the present invention will now be described.

EXAMPLES 1 TO 8

Figure 4:
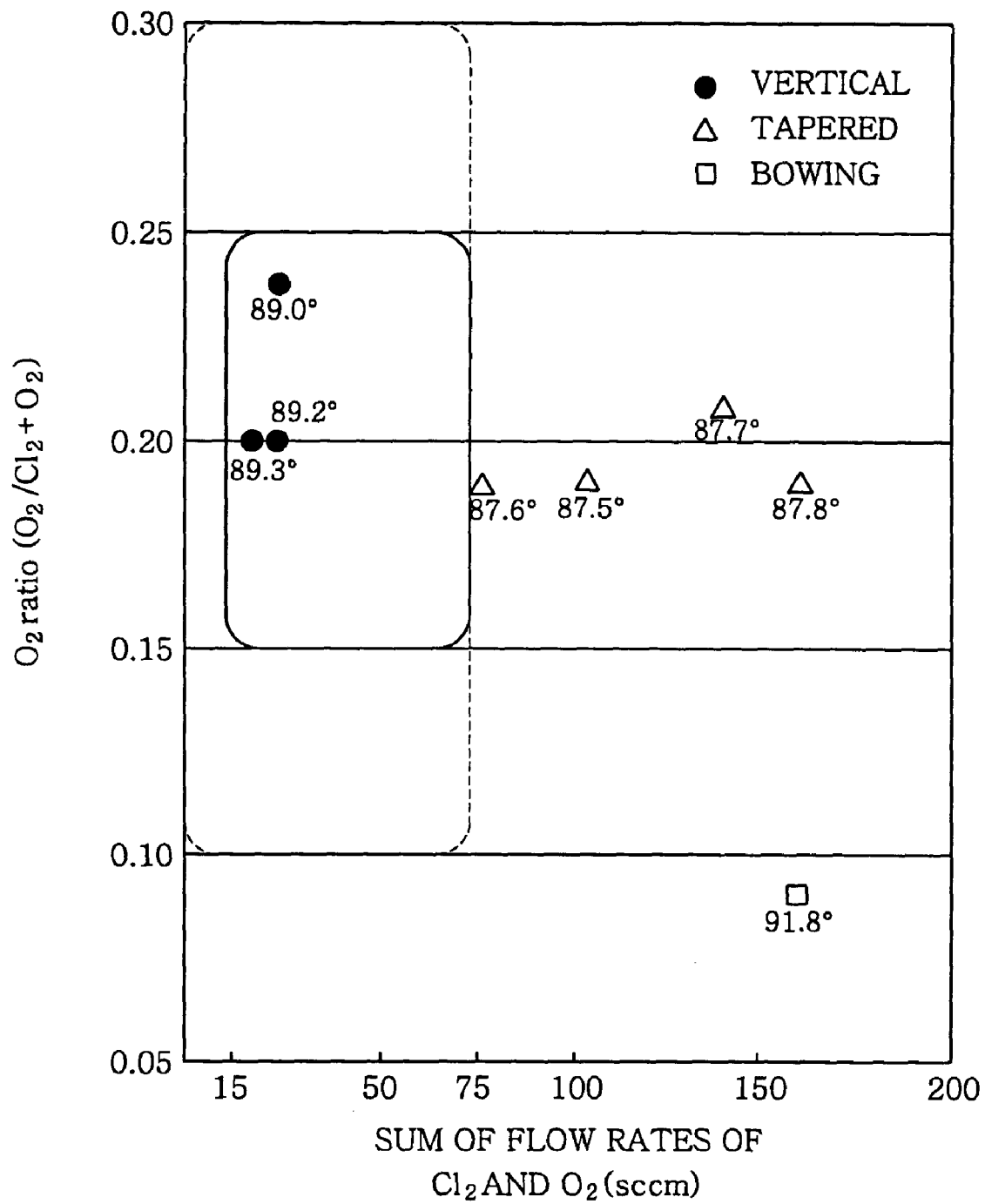
FIG. 4 presents a graph displaying a dependency of a taper angle on a sum of flow rates of $Cl_2$ and $O_2$, and on an $O_2$ ratio (a ratio of a flow rate of $O_2$ to the sum of the flow rates of $Cl_2$ and $O_2$)
Figure 6:
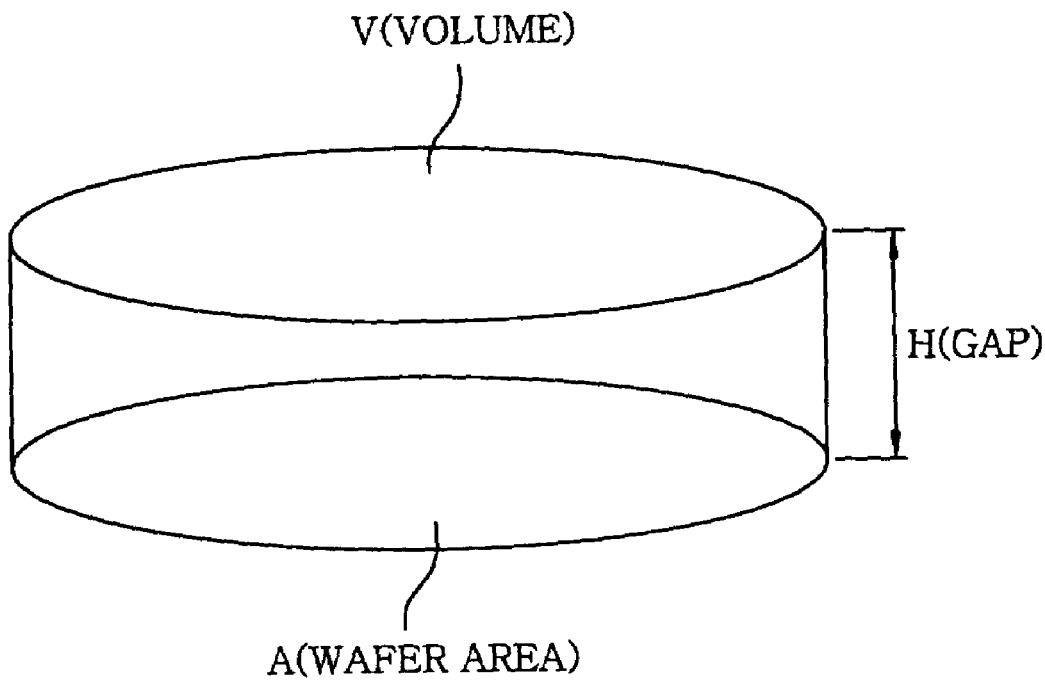
FIG. 6 presents a definition of a residence time.

Trench etchings for forming a trench for DTI, which has an opening width of about 0.3 µm and a depth of about 3 to about 6 µm, were performed by using the plasma etching apparatus shown in FIG. 1 while varying gas flow rates of $Cl_2$, $O_2$ and $NF_3$ included in the etching gas and ratios of flow rates thereof. FIGS. 3 and 4 show the resultant data obtained from the examples 1 to 8. The other major etching conditions are as follows:

Diameter of the Si wafer; 200 mm
Mask made of two material layers;
 upper layer—$SiO_2$ layer of 3000 Å
 lower layer—SiN layer of 1500 Å
Pressure; 60 mtorr
RF power (upper electrode/lower electrode);
 500 W/600 W
Electrode gap; 115 mm
Temperature (upper electrode/lower electrode/chamber sidewall); 80° C./60° C./60° C.
Comparative examples of etching DTI in Si also have been carried out for comparison.

Comparative Examples 1 and 2

Trench etchings for forming a trench for DTI, which has an opening width of about 0.3 µm and a depth of about 3 to about 6 µm, were performed by using the plasma etching apparatus shown in FIG. 1 while using a mixture gas of HBr, $O_2$ and $NF_3$ (Comparative embodiment 1) or a mixture gas of HBr and $O_2$ (Comparative embodiment 2) as the etching gas. Other etching conditions were identical to those of the examples 1 to 8 excepting that the electrode gap was 120 mm. FIG. 5 shows the resultant data obtained from the comparative examples 1 and 2.

As indicated in FIGS. 3 and 5, etching rates (E/R) of examples 1 to 8 are greater than about 0.78 µm/min, while etching rates of comparative examples 1 and 2 are about 0.25 µm/min. Thus, the etching rates of the examples 1 to 8 are greater than three times those of the comparative examples 1 and 2.

Further, a taper angle of the comparative example 1 (92.3°) exceeds 90°, so that a trench thereof has a reversely tapered profile or a bowing profile and a taper angle of the comparative example 2 (87.5°) is less than 89°, so that a trench thereof has a tapered profile. Thus, a trench having a near-vertical profile can be achieved in neither of the comparative examples 1 and 2.

In contrast, taper angles of the examples 1 to 3 are 89.3°, 89.0° and 89.2° respectively, so that they are within a range between 89° and 90°. Thus, trenches thereof have a near-vertical profile. However, taper angles of the examples 4 to 7 are 87.60°, 87.50° and 87.7° respectively, so that trenches thereof have a tapered profile. And trench of the example 8 has a taper angle of 91.8° of a bowing profile.

As can be seen from the data of examples shown in FIG. 3, flow rates of the examples 1 to 3, particularly sums of flow rates of $Cl_2$ and $O_2$ thereof, are comparatively small. More specifically, in the examples 1 to 3, flow rates of the etching gases are equal to or less than 45 sccm (i.e., less than about 100 sccm), and residence times are equal to or greater than 380 sccm (i.e., equal to or greater than about 180 sccm). In addition, the sum of flow rates of $Cl_2$ and $O_2$ in each of the examples 1 to 3 is equal to or less than 25 sccm. In contrast, in examples 4 and 8, total flow rates of the etching gases are equal to or greater than 100 sccm and residence times are less than 180 sccm. The residence time τ is defined as follows with reference to FIG. 6:

$$\tau = V(=A \times H)/S = PV/Q \qquad \text{Eq. 1}$$

where V represents a volume of the etching processing space (i.e., an effective volume of etching space formed on a wafer) (liter); A, an area of the wafer; H, the electrode gap, i.e., the distance between the upper and the lower electrodes; S, an exhaust rate of the etching gas (liter/second); p, an etching pressure, i.e., an inner pressure of the chamber 10 (torr); and Q, a total flow rate of the etching gas (torr×liter/second).

In order to form a trench having an opening of a minute width of about 0.3 µm and a depth of about 3 to about 6 µm with vertical sidewalls, it is important to control the residence time of the etching gas, i.e., the flow rate of the etching gas containing $Cl_2$, $O_2$ and $NF_3$, and more particularly, the sum of the flow rates of $Cl_2$ and $O_2$. From FIG. 3, it can be seen that it is preferable to set the residence time to be equal to or greater than about 180 msec. And to do this, the flow rate of the etching gas needs to be equal to or less than about 95 sccm. Further, it is preferable that the sum of the flow rates of $Cl_2$ and $O_2$ is set to be equal to or less than about 80% of the total flow rate of the etching gas, i.e., about 75 sccm. If the sum of the flow rates of $Cl_2$ and $O_2$ is high, a deposition rate at the bottom of the trench exceeds an etching rate thereat, so that the groove is more likely to have a tapered profile. Since, however, the etching rate is deteriorated when the sum of the flow rates of $Cl_2$ and $O_2$ is too low, it is preferable to set the flow rate thereof to be equal to or greater than about 15 sccm.

Further, $O_2$ ratio, i.e., the ratio of the flow rate of $O_2$ to the sum of the flow rates of $Cl_2$ and $O_2$, is also an important factor. In other words, when the $O_2$ ratio is too low as in the example 8 (0.09), the deposition rate is less than the etching rate, so that etched trench is tends to have a reversely tapered profile or a bowing profile. In contrast, when the $O_2$ ratio is excessively high, the deposition rate exceeds the etching rate, so that the etched trench is apt to have a tapered profile and the etching rate decreases. Thus, it is preferable to set the $O_2$ ratio to range from about 0.1 to about 0.3 and more preferable from about 0.15 to about 0.25.

Although the flow rate of $NF_3$ gas was to be constant at 20 sccm in the examples 1 to 8, it has been found that varying the flow rate of $NF_3$ within the range from about 10 to 30 sccm does not significantly affect the etching characteristics. It is also preferable to set the flow rate of the $NF_3$ to be equal or greater than about 20% of the total flow rate of the etching gas.

Further, although the pressure was set to be constant level of 60 mtorr in the examples 1 to 8, it is preferable to determine or optimize the etching pressure depending on other etching conditions and the dimension of the trench since the pressure is an important parameter affecting both the residence time and the etching rate. In the examples 1 to 8, power densities of the upper and lower electrodes are 1.6 $W/cm^2$ and 1.9 $W/cm^2$ respectively (obtained from the RF powers thereof, which are 500 W and 600 W respectively). However, it is also preferable to optimize the RF powers or the power densities depending on other etching conditions and the dimension of the trench.

Further, as shown in FIG. 3, an etching selectivity of the mask, i.e., a ratio of Si etching rate to $SiO_2$ etching rate, in the example 2 is 28.70. Such a level of etching selectivity as in the example 2 is obtained in the other examples and comparative examples 1 and 2. In the present invention employing the etching gas of the mixture of $Cl_2$, $O_2$ and $NF_3$, it is preferable to employ a mask having at least a $SiO_2$ layer at the surface thereof.

Although the plasma etching apparatus of the preferred embodiment has been described as having electrodes of a capacitance coupling type parallel plates, it should be apparent to those of the prior art that other types such as magnetron RIE and ECR (electron cyclotron resonance) can be also employed in the present invention. It is also to be noted that the etching apparatus and etching method of the present invention are applicable to any types of objects, e.g., a Si substrate or a substrate having a Si layer.

As described above, by optimizing the flow rates of $Cl_2$, $O_2$ and $NF_3$ used as the etching gas of Si, the present invention provides an etching method and an etching apparatus compatible with a high aspect ratio and capable of improving an etching rate.

While the invention has been shown and described with respect to the preferred embodiments, it will be understood by those skilled in the art that various changes and modifications may be made without departing from the spirit and scope of the invention as defined in the following claims.

What is claimed is:

1. A method for dry-etching a Si substrate or a Si layer in a processing chamber, comprising the step of:

forming, in the Si substrate or the Si layer, a trench having a substantially vertical sidewall by supplying an etching gas into the processing chamber, wherein the etching gas is a mixture gas including $Cl_2$, $O_2$ and $NF_3$ and a residence time $\tau$ of the etching gas is equal to or greater than about 180 msec, the residence time $\tau$ being defined as:

$$\tau = pV/Q$$

where p represents an inner pressure of the processing chamber; V, an effective volume of etching space formed on the Si substrate or the Si layer; and Q, a flow rate of the etching gas.

2. The method of claim 1, wherein a sum of flow rates of $Cl_2$ and $O_2$ is equal to or less than about 80% of a flow rate of the etching gas.

3. The method of claim 1, wherein a ratio of a flow rate of $O_2$ to a sum of flow rates of $Cl_2$ and $O_2$ ranges from about 0.1 to about 0.3.

4. The method of claim 1, wherein the flow rate of the etching gas is equal to or less than about 100 sccm.

5. The method of claim 1, wherein the inner pressure of the processing chamber ranges from about 20 mtorr to about 200 mtorr.

6. The method of claim 1, wherein the processing chamber is provided with two electrodes for generating a plasma of the etching gas therebetween and a distance between the electrodes ranges from about 30 mm to about 300 mm.

* * * * *